United States Patent
Nisenblat et al.

(10) Patent No.: US 7,415,370 B2
(45) Date of Patent: Aug. 19, 2008

(54) METHOD OF COMPRESSING VALUES OF A MONITORED ELECTRICAL POWER SIGNAL

(75) Inventors: Pol Nisenblat, Haifa (IL); Amir Mordehay Broshi, Hod Hasharon (IL); Ofir Efrati, Raanana (IL)

(73) Assignee: ELSPEC Ltd., Caesaria (IL)

( * ) Notice: Subject to any disclaimer, the term of this patent is extended or adjusted under 35 U.S.C. 154(b) by 0 days.

(21) Appl. No.: 10/567,573

(22) PCT Filed: Apr. 18, 2004

(86) PCT No.: PCT/IL2004/000332

§ 371 (c)(1),
(2), (4) Date: Feb. 8, 2006

(87) PCT Pub. No.: WO2005/101032

PCT Pub. Date: Oct. 27, 2005

(65) Prior Publication Data
US 2006/0212238 A1      Sep. 21, 2006

(51) Int. Cl.
*G01R 13/00* (2006.01)
*G06F 17/00* (2006.01)

(52) U.S. Cl. .............................. 702/66; 702/70; 702/74; 702/75; 702/80

(58) Field of Classification Search ............... 702/66
See application file for complete search history.

(56) References Cited

U.S. PATENT DOCUMENTS

| | | | |
|---|---|---|---|
| 5,736,847 A | * | 4/1998 | Van Doorn et al. ........... 324/142 |
| 5,836,982 A | * | 11/1998 | Muhlenberg et al. ........... 607/9 |
| 6,473,700 B1 | * | 10/2002 | Holaday et al. ............... 702/66 |
| 6,493,666 B2 | * | 12/2002 | Wiese, Jr. .................... 704/230 |
| 6,599,242 B1 | * | 7/2003 | Splett et al. ................. 600/300 |
| 6,615,147 B1 | | 9/2003 | Jonker et al. |
| 6,639,518 B1 | | 10/2003 | Curtis |
| 6,671,654 B1 | | 12/2003 | Forth et al. |
| 6,675,071 B1 | * | 1/2004 | Griffin et al. ................ 700/286 |
| 7,071,852 B1 | * | 7/2006 | Wegener ...................... 341/61 |

OTHER PUBLICATIONS

Ribeiro et al., "An enhanced data compression method for applications in power quality analysis", Nov. 29-Dec. 2, 2001, IEEE, The 27th Annual Conference of the IEEE Industrial Electronics Society, 2001. IECON '01, vol. 1, pp. 676-681.*

Galli et al., "Exploring the power of wavelet analysis", Oct. 1996, IEEE, IEEE Computer Applications in Power, vol. 9, issue 4, pp. 37-41.*

Ribeiro et al., "An improved method for signal processing and compression in power quality evaluation", Apr. 2004, IEEE, IEEE Transactions on Power Delivery, vol. 19, issue 2, pp. 464-471.*

International Search Report for International Application No. PCT/IL04/00332 mailed Mar. 1, 2005, 1 page.

* cited by examiner

*Primary Examiner*—Hal D Wachsman
(74) *Attorney, Agent, or Firm*—Pearl Cohen Zedek Latzer, LLP

(57) ABSTRACT

A method of compressing values of a waveform of a monitored electrical power signal. The method includes acquiring data representative of periods of the waveform, decomposing the waveform of the power signal into a plurality of components over a plurality of periods of the waveform, compressing the values of at least some of the components over a plurality of periods, and storing these values and extents.

34 Claims, 4 Drawing Sheets

US 7,415,370 B2

METHOD OF COMPRESSING VALUES OF A MONITORED ELECTRICAL POWER SIGNAL

CROSS-REFERENCE TO RELATED APPLICATIONS

This application is a National Phase Application of PCT International Application No. PCT/IL2004/000332, International Filing Date Apr. 18, 2004, the entire disclosure of which is hereby incorporated by reference.

FIELD OF THE INVENTION

The present invention relates to the field of power quality monitoring and particularly to storage for later reference of power quality data.

BACKGROUND OF THE INVENTION

In order to provide high quality electric power service, it is desired to monitor the quality of the electric signals at different locations along an electrical power network. Particularly it is desired to know the waveform of the current and voltage at various network locations at the time at which a specific event occurred (e.g., a blackout) in order to understand the cause of the event.

U.S. Pat. No. 5,736,847 to Van Doom et al., the disclosure of which is incorporated herein by reference, describes a power meter for reading and displaying electrical power waveforms and calculating parameters of the waveforms. These parameters may include, for example, current, voltage, power, phase relationship between waveforms of a multiphase signal, power factor, frequency, kilo watt hour (KWH), kilo Volt Amper reactive energy (KVAR), KVARH, KVA and KVAH.

In some cases, however, on-line display of the waveforms and/or deduced parameters is not sufficient. U.S. Pat. No. 6,675,071 to Griffin, Jr. et al., the disclosure of which is incorporated herein by reference, states that it would be desired to implement a power quality device that captures all the voltage waveform data at all times, but that such device is impracticable due to the large amounts of data involved. At a sampling rate of 32 samples per cycle, 1920 samples are collected per second. For three-phase meters that measure both voltage and current waveforms, the data is 6-8 times as much. The U.S. Pat. No. 6,675,071 patent suggests detecting variations in the waveforms and capturing data relating to the times of the detected variations.

U.S. Pat. No. 6,671,654 to Forth et al., the disclosure of which is incorporated herein by reference, describes an electronic device for measuring power parameters from a power distribution system. As in the '071 patent, data is stored only when an event occurs (e.g., an abrupt change in the current or voltage).

U.S. Pat. No. 6,639,518 to Curtis, the disclosure of which is incorporated herein by reference, describes a circuit monitor which monitors one or more metered values in an electrical circuit. The monitor includes a system for selecting alarm set-points.

Some monitoring systems store only the root mean square (RMS) and/or power of the electrical signals. This data, however, is not always sufficient to determine the exact nature of problems.

SUMMARY OF THE INVENTION

An aspect of some embodiments of the invention relates to an apparatus for continuously storing the waveform of one or more power signals, regardless of whether an event of interest was identified. The apparatus optionally includes memory sufficient to store the waveform, under normal power conditions, over a long period of time, of at least a month, two months or even a year. Storing the waveform over such a long period allows looking back to events to determine different parameters than were considered important at the time of an event and/or allows looking back to events that at the time they occurred were not considered important or were not identified at all.

In some embodiments of the invention, the data of the continuously stored signals are compressed using a compression method that optionally takes into account the nature of the electrical power signals. Optionally, the compression method is performed in real time, as the signals are acquired, such that compression decisions are performed before all the compressed data was received. The compression for any specific segment of the data is optionally performed based on a small segment of the data. In some embodiments of the invention, the amount of uncompressed data viewed by a processor performing the compression in generating any piece of compressed data, is relatively small, for example less than a minute, a second, or even a tenth of a second of the uncompressed data. Optionally, the amount of memory available for use and/or actually used for compression by the compression processor is less than 100 Kbytes or even 10 Kbytes.

In accordance with some embodiments of the invention, the processing power and/or development resources that were heretofore spent on identifying events are directed towards compressing and storing the large amounts of data involved in storing the waveform data.

The storage of the waveform is optionally performed with a high accuracy of at least 64, 128, 256 or even 512 samples per electrical cycle time (generally $\frac{1}{50}$ or $\frac{1}{60}$ second).

An aspect of some embodiments of the invention relates to using a lossy compression method in compressing monitored power signals. Using a lossy compression method for power signals allows achieving a high compression ratio, which allows storing large volumes of data, with a relatively low quality reduction. In accordance with some embodiments of the invention, instead of accurately storing a limited number of parameters, the entire electrical power waveform is stored with a slight loss of accuracy. Optionally, accurate values of one or more highly useful parameters are stored along with the waveform, in case more accurate information is also required. The lossy compression optionally involves loss of up to about 1-2% of the accuracy, preferably about 0.1%, while achieving a compression ratio of 1:500, 1:1000 or greater.

The lossy compression is optionally performed in real time. The real time compression may require, in some cases, a compression unit with relatively high processing power requirements.

An aspect of some embodiments of the invention relates to real-time compression of monitored power signals. The real time compression is performed on the fly, without requiring the compression unit to have a large internal memory. Alternatively or additionally, the real time compression is performed on each sample within less than a second or even half a second of when it was acquired.

An aspect of some embodiments of the invention relates to compression of electrical power signals by decomposing the signals into a plurality of components (e.g., frequency components) and compressing each of the components separately over a relatively long time span. In some embodiments of the invention, the compression fits the values of each of the components over time into a model which can be represented using a small amount of data. For example, components having same values are optionally represented together by stating values and time spans in which the values appear. The compression of the values of each component are optionally compressed without relating to the values of any of the other components. Optionally, the power signal in each cycle is decomposed into its components and the values of the components are compressed over a plurality of cycles together.

Optionally, the compression comprises a lossy compression which ignores small errors in fitting the values of the components the models. In some embodiments of the invention, the lossy compression ignores errors smaller than the measurement accuracy of the apparatus.

In some embodiments of the invention, the plurality of components comprise frequency components (i.e., harmonics). The frequency components are optionally generated by applying a transform, such as a Fourier transform (e.g., DFT, FFT), a cosine transform (DCT) or a Z transform, to the time domain samples. Alternatively or additionally, the frequency components are generated using an array of filters, digital or analog, corresponding to the different frequencies. Further alternatively or additionally, the frequency components are generated using time pattern recognition. Alternatively to frequency components, the components comprises time components, for example time fragments of the cycle of the power signal.

Optionally, the electrical power signal is represented by storing, for each harmonic, average values and respective numbers of consecutive cycles in which the harmonic has a value close to the average value. Although performing a Fourier transform is relatively processing intensive, the compression ratio achieved, and hence the ability to store power signals of long time periods, is considered advantageous.

In some embodiments of the invention, the length of the cycle of the power signal is continuously monitored (i.e., how close it is to the nominal 50 or 60 Hz), so that the Fourier transform is accurately performed on the signals of a cycle without skewing out of the cycle. In some embodiments of the invention, the rate of sampling of the power signals is adjusted according to the cycle length, so that each cycle has substantially the same number of samples, regardless of its length. Optionally, each cycle has a predetermined number of samples which is suitable for fast Fourier transformation (e.g., 256 samples).

By accurately following the cycles of the power signals, the harmonic values generally have the same or very similar values over long spans of signals. Thus, if only changes are stored, the compression achieves for normal electrical signals very high compression ratios (e.g., 1:10,000), which allow storage of large amounts of data.

In some embodiments of the invention, the values of harmonics which have very low values (i.e., close to zero) are not stored. Generally, many harmonics of cycles of electrical power signals have substantially zero values and therefore do not require storage space, especially when the monitored power lines are functioning satisfactorily.

An aspect of some embodiments of the invention relates to storing the waveform of an electrical signal over a long period of at least a week or even a month by storing the spectral components of the signal. Optionally, the spectral components are compressed.

There is therefore provided in accordance with an exemplary embodiment of the invention, a method of compressing values of a waveform of a monitored electrical power signal, comprising acquiring data representing periods of the waveform, decomposing the waveform of the power signal into a plurality of components, over a plurality of periods of the waveform and compressing the values of at least some of the components over a plurality of periods, separately.

Optionally, decomposing the waveform of the power signal into components comprises decomposing the waveform of the power signal into frequency components. Optionally, compressing the values of at least some of the components comprises fitting time segments of the components into a model and recording coefficients of the fitting. Optionally, the model comprises a constant function over time. Optionally, the recorded coefficients for the constant function over time comprise a single value and a length. Optionally, the model comprises a monotonous function over time. Optionally, acquiring data representing periods of the waveform comprises acquiring samples of the power signal and dividing the samples into groups corresponding to cycles of the power signal. Optionally, decomposing the waveform comprises transforming the samples of each group, into harmonic component values.

Optionally, compressing at least some of the components separately comprises storing for each harmonic, pairs of an average value and a number of cycles in which the value is close to the average value. Optionally, the number of cycles in which the value is close to the average value is determined by determining a minimum and maximum of a train of harmonic values and determining when the distance between the minimum and maximum is greater than a predetermined distance. Optionally, the predetermined distance is a configured percentage of the average recent value of the harmonic. Optionally, the predetermined distance is a configured percentage of a configured expected value of the harmonic.

Optionally, acquiring the samples comprises acquiring an analog signal and sampling the signals. Optionally, dividing the samples into groups comprises repetitively determining a main power frequency of the signal and accordingly determining cycles of the power signal.

Optionally, sampling the signals comprises sampling at a rate determined responsive to the main power frequency. Optionally, repetitively determining the main power frequency comprises determining from the acquired samples. Alternatively or additionally, repetitively determining the main power frequency comprises determining from an analog signal from which the acquired samples are generated. Optionally, transforming the samples of each group comprises transforming using a fast Fourier transform.

Optionally, the method includes applying a lossless compression method to the compressed harmonic values. Optionally, the method includes storing at least some of the compressed components in a file structure representing a plurality of power signals. Optionally, the method includes storing the compressed components in a file structure representing the power signal continuously over more than a month. Optionally, the method includes transmitting the compressed components over a communication link. Optionally, compressing at least some of the components comprises compressing each of the components separately. Optionally, compressing at least some of the components comprises compressing in real time and/or using a lossy compression. Optionally, compressing at least some of the components separately comprises compressing separately over at least three periods of the waveform. Optionally, the power signal comprises a current signal or a voltage signal. Optionally, acquiring data representing periods of the waveforms comprises acquiring data representing cycles of the waveform.

Optionally, acquiring data representing periods of the waveforms comprises acquiring data representing periods shorter or longer than the cycles of the waveform.

Optionally, decomposing the waveform into a plurality of components comprises decomposing into components which co-extend in time.

There is further provided in accordance with an exemplary embodiment of the invention, a method of compressing values of a monitored electrical power signal, comprising acquiring samples of the power signal, dividing the samples into groups corresponding to cycles of the power signal, transforming the samples of each group into harmonic component values and storing a representation of the harmonic component values on a non-volatile storage medium, continuously over at least a week.

Optionally, storing the representation comprises storing a compressed representation of the harmonic component values. Optionally, storing the compressed representation comprises storing a compression based on compressing together values of each harmonic component over a plurality of cycles.

There is further provided in accordance with an exemplary embodiment of the invention, a device for monitoring electrical power signals, comprising a power line interface for measuring power line signals, a non-volatile storage medium; and a processor adapted to store a representation of waveform information of measured power line signals on the storage medium continuously, regardless of whether a special event was identified.

Optionally, the power line signals comprise at least one current signal and/or at least one voltage signal. Optionally, the processor is adapted to store the representation continuously over at least a week. Optionally, the device is not adapted to identify special events. Optionally, the storage medium has a capacity smaller than 1 Gbyte. Alternatively, the storage medium has a capacity greater than 1 Gbyte. Optionally, the processor is adapted to compress the measured power signals with at least a predetermined minimal compression ratio.

Optionally, the processor is adapted to adjust the loss level of the compression in order to achieve the predetermined minimal compression ratio. Optionally, the processor is adapted to compress the measured power signals in real time. Optionally, the processor is adapted to compress the measured power signals with a lossy compression method. Optionally, the interface is adapted to provide samples of the power signals at a rate of at least 8 samples per cycle of the power signals.

There is further provided in accordance with an exemplary embodiment of the invention, a method of compressing values of a monitored electrical power signal, comprising acquiring samples of the power signal and compressing the samples of the power signal using a lossy compression method. Optionally, compressing the samples comprises compressing in real time. Optionally, acquiring the samples comprises acquiring at a rate of at least 50 samples per cycle of the power signal.

BRIEF DESCRIPTION OF THE DRAWINGS

Particular exemplary embodiments of the invention will be described with reference to the following description of embodiments in conjunction with the figures, wherein identical structures, elements or parts which appear in more than one figure are generally labeled with a same or similar number in all the figures in which they appear, in which.

DETAILED DESCRIPTION OF EXEMPLARY EMBODIMENTS

Figure 1:
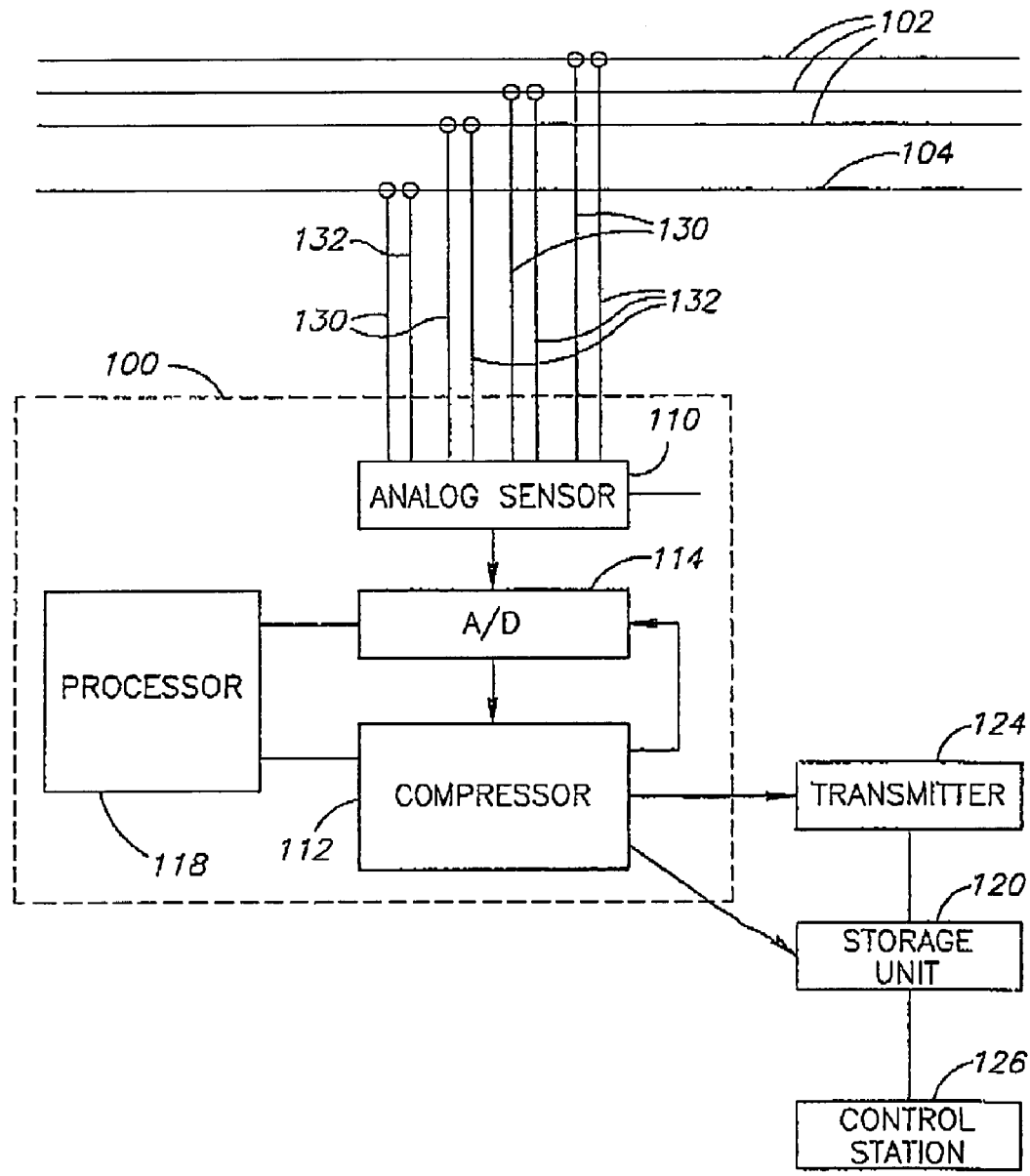
FIG. 1 is a schematic diagram of a compression unit, in accordance with an exemplary embodiment of the invention.

FIG. 1 is a schematic illustration of a compression unit 100, in accordance with an exemplary embodiment of the invention. Compression unit 100 optionally connects to electrical wires, for example to three phase lines 102 and a neutral line 104, to monitor the signals passing thereon, for quality monitoring. Compression unit 100 compresses the signals sensed from the electrical wires in order to allow storage of monitoring data for large durations, optionally continuously without relation to whether an event of interest was identified. In some embodiments of the invention, compression unit 100 includes current measurement connections 130 and voltage measurement connections 132. The connections may include physical connections, magnetic field connections and/or using any other coupling.

Compression unit 100 optionally includes an analog sensor 110 which senses the monitored signals, an A/D converter 114 which converts the sensed analog signals into digital samples, and a compressor 112, which performs the compression. In some embodiments of the invention, compression unit 110 further comprises a processor 118 which determines one or more parameters of the raw sensed data, such as one or more of power, phase relationship between waveforms of a multi-phase signal, power factor, main power frequency, kilo watts per hour (KWH), KVAR, KVARH, KVA, total harmonic distortion (THD), root mean square (RMS) current, RMS voltage and KVAH. At least some of these parameters are optionally computed for each phase. Alternatively or additionally, the monitored parameters include sag, swell and/or flickering parameters and/or data used in determining these parameters. In some cases, the ratio between values for various phases is calculated. The parameters calculated by processor 118 may be compressed by compressor 112 and/or may be used for generating alerts, as is known in the art. The parameters calculated by processor 118 are optionally parameters which have a high usefulness and/or parameters which are relatively affected by small inaccuracies in the waveforms. These parameters are optionally stored in addition to the waveform itself, in order to avoid the inaccuracies due to the lossy compression applied to the waveforms.

Compressor 112 optionally performs the compression in real time, such that signals are compressed within less than a second or even a tenth of a second from when they were acquired. The compressed data from compressor 112 is optionally stored on a storage unit 120 of any type known in the art, such as a disk drive, a compact flash memory or any other non volatile memory. In some embodiments of the invention, storage unit 120 is relatively large so that it can store data accumulated over months or even more than a year. Optionally, storage unit 120 is relatively large, i.e., greater than 1 Gbyte, 10 Gbyte or even 40 Gbyte. Alternatively or additionally, the compression of compressor 112 is very high, such that a relatively small storage unit 120, even smaller than 1 Gbyte is sufficient.

In some embodiments of the invention, compressor 112 includes a cache memory which stores data temporarily until it is stored on storage unit 120. Alternatively or additionally, the cache memory stores the data required for the compression. The cache memory optionally has a size smaller than 10 Mbytes, 1 Mbyte or even smaller than 100 Kbytes.

Alternatively or additionally to storing the compressed signals, the compressed signals are transferred to a transmitter 124 for transmission to a remote unit. The signals are compressed before their transmission in order to allow transmission at a reasonable bandwidth. The transmission may be performed using any communication link known in the art, including on the monitored power lines, wireless links, cable and/or telephone lines. At the remote unit, the transmitted signals may be stored, displayed and/or analyzed. In some embodiments of the invention, the compressed signals stored in storage unit 120 are accessible from a control station 126, which may be used to display and/or analyze the compressed signals. As described hereinbelow, the signals are optionally stored in a manner which allows fast retrieval of signals of a specific date and/or type. Control unit 126 is optionally also used to configure operation attributes of compression unit 100.

Analog sensor 110 may be of any type known in the art, including those described in above mentioned U.S. Pat. No. 5,736,847. Compressor 112 optionally has sufficient processing power in order to perform a Fourier transform (e.g., FFT) on each of the monitored signals, for each cycle of the power signal.

A/D converter 114 optionally operates at a rate sufficient to cover a desired number of harmonics of the sensed signals. In some embodiments of the invention, A/D converter 114 operates at a predetermined sufficiently high rate. Alternatively, the sampling rate of A/D converter 114 is adjusted according to the main power frequency of the measured signals. Optionally, a different sampling rate may be used for different lines and/or for different signals (e.g., current, voltage) on the same line. Alternatively, the same sampling rate is used for all the signals sampled by analog sensor 110.

A/D converter 114 may have substantially any suitable sampling word size, for example 16 bits. The sampling word size is optionally selected according to the accuracy of the measurement apparatus.

Figure 2:
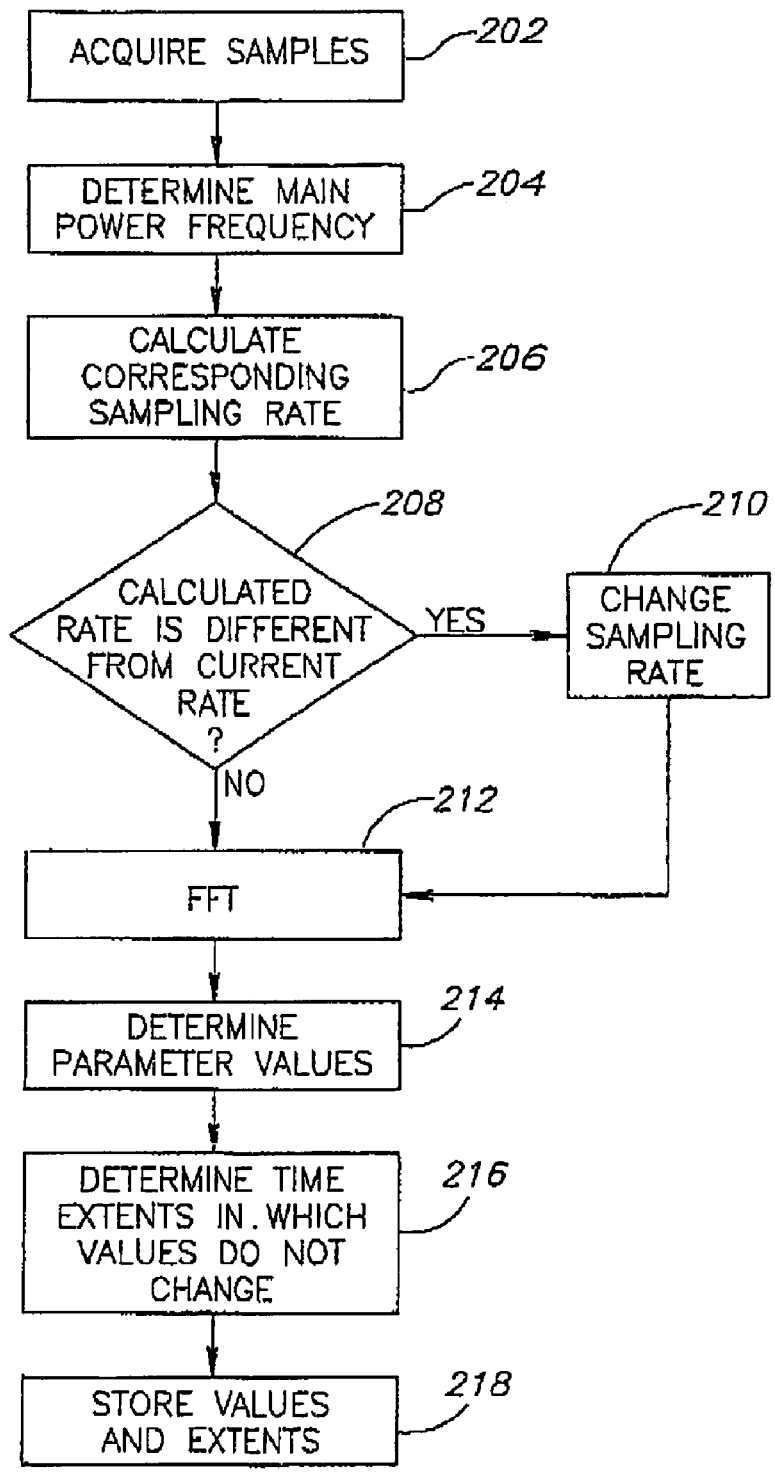
FIG. 2 is a flowchart of a compression method, in accordance with an exemplary embodiment of the invention.

FIG. 2 is a flowchart of a compression method, in accordance with an exemplary embodiment of the invention. Based on the sampled (202) signals, the main power frequency is determined (204), using any method known in the art, such as any phase loop locking (PLL) method, optionally utilizing such characteristics as zero crossing detection or auto-correlation. A sampling rate corresponding to the main power frequency is calculated (206). If (208) the calculated sampling rate is substantially different from the current sampling rate of A/D converter 114, the sampling rate is changed (210) to the calculated sampling rate, immediately after the determination that the change is required or one or more cycles later. Alternatively, the change is performed gradually for example using a hysterezis algorithm.

The samples of each cycle of the sensed signals are transformed (212) into the frequency domain (i.e., into harmonic vectors formed of real and imaginary values), optionally using a fast Fourier transform (FFT). Alternatively or additionally, the values of one or more parameters of the sensed signals are determined (214). For each parameter and harmonic, compressor 112 determines (216) time (or sample) extents during which its value does not change substantially, keeping track of values and respective equal value extent lengths. An exemplary embodiment of determining (216) the time extents is described hereinbelow, with reference to FIG. 3. The determined (216) values and extents are optionally stored (218) in a suitable file format, for example as described below with reference to FIG. 4. In some embodiments of the invention, the file format is further compressed using any suitable lossless and/or general purpose (i.e., not depending on the type of data represented by the compressed signals) compression method known in the art, such as Lempel Ziv Welch (LZW) compression.

Referring in more detail to calculating (206) the corresponding sampling rate of the frequency, in some embodiments of the invention, the sampling rate is based on the number of harmonics to be used in the compression. In an exemplary embodiment of the invention, 128 harmonics are used, although more harmonics may be used in order to achieve a more accurate compression and/or in order to catch high frequencies and/or transient events. For example, a sampling rate of 1 MHz corresponding to about 20,000 harmonics, in a 50 HZ main power frequency, may be used in order to catch fast transients on the monitored electrical signals. As the high harmonics generally have zero values, the size of the compressed signals is not substantially affected by the use of such a large number of harmonics. Alternatively, fewer harmonics (e.g., 32) may be used when high accuracy is not needed, in order to reduce the processing power required from compressor 112 in performing Fourier transforms. The sampling rate used is optionally equal to twice the main power frequency times the number of harmonics, such that for each cycle of the monitored signals there is a sufficient number of samples for constructing the desired number of harmonics. For example, in order to achieve 128 harmonics, for a power line operating at a 50 Hz frequency, a sampling rate of 12.8 KHz is used, while for a 60 Hz frequency, a sampling rate of 15.36 KHz is used.

Referring in more detail to determining whether (208) the calculated sampling rate is substantially different from the current sampling rate, in some embodiments of the invention, the values are considered substantially different based on the effect the difference has on compression. Optionally, when the difference has a high chance of causing the values of consecutive FFT cycles to be different even though the cycles of the monitored electrical signals are substantially the same, the sampling rate of A/D converter 114 is changed (210).

Alternatively to determining the main power frequency based on the sampled values, the main power frequency is determined from the analog signals using methods known in the art. Optionally, when compression unit 100 operates on a plurality of power lines the sampling rate is determined based on the average main frequency of the lines or based on the main frequency of one of the lines used as a representative power line, as the frequencies of the related power lines are generally the same. Alternatively or additionally, for example when the different power lines are not related, different sampling rates are used for the different power lines.

Alternatively to adjusting the sampling rate according to changes in the main frequency, a sampling rate higher than required is used, and the main frequency is used to group the samples into cycles. Optionally, in accordance with this alternative, a digital Fourier transform (DFT) or any other transform, such as a Z transform or DCT transform, is used instead of an FFT. Alternatively, the samples are re-sampled into a number of samples required for the FFT.

In some embodiments of the invention, if synchronization with the signal from which the main power frequency is determined is lost, the last determined main power frequency is used in determining the cycle length (for other monitored signals), until the synchronization is restored.

Alternatively to using the FFT transform, any other method may be used to convert the values of each cycle into harmonics. These alternative methods may include for example other transforms, such as the DCT transform or the Z transform. Alternatively or additionally, filter arrays and/or time pattern recognition are used to convert the values of each cycle into harmonics. Referring in more detail to determining (216) time extents in which the values do not change substantially, in some embodiments of the invention, when the values change slightly in accordance with a predetermined pattern, this is stated in the compressed format. This allows more accurate reconstruction of the signals and/or use of higher tolerance values.

Alternatively or additionally to determining (216) time extents during which the value of the harmonic does not change substantially, compressor 112 may attempt to fit the measured values into a predetermined function or pattern, for example into a monotonous increasing or decreasing line and/or into a polynomial of a low order. Further alternatively or additionally, compressor 112 selects from a predetermined set of functions, a function which achieves a best fit of the values into the function. The results of the compression include an indication of the selected function and the coefficients used.

Figure 3:
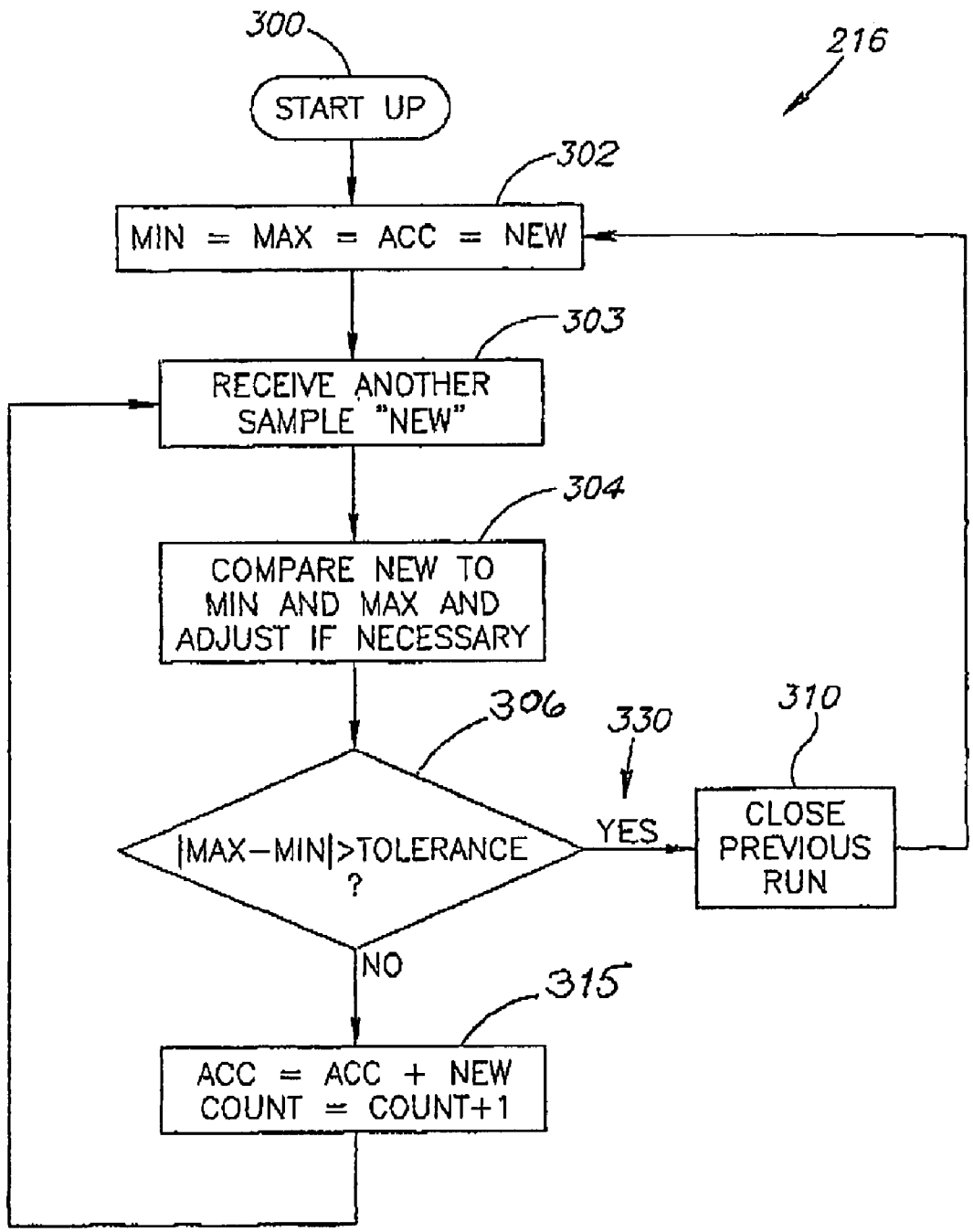
FIG. 3 is a flowchart of a method of determining time extents in which the values of a harmonic or a parameter are substantially the same, in accordance with an exemplary embodiment of the invention.

FIG. 3 is a flowchart of a method of determining (216) time extents in which the values of a harmonic or a parameter (referred to below, for simplicity, together using the collective term "harmonic") are substantially the same, in accordance with an exemplary embodiment of the invention. In the procedure of FIG. 3, variables min, max, acc and average, store respectively the minimal, maximal, sum and average values of the values of the harmonic during a run in which the values are substantially the same (i.e., the difference between min and max is small). The variable count stores the number of values in the current run of values.

At start up (300), when a new signal record is begun (as described below with reference to FIG. 4) and when (330) a substantially different value is received for a harmonic, variables min, max and acc are set (302) to the value of the newly received value, referred to herein using the variable new, i.e., min=max=acc=new. Another newly received value (new) is then received (303). The next received (304) value new is compared to min and max in order to determine if the value of either of these variables should be changed, i.e., If new<min then min=new
else if new>max then max=new.

The difference between the minimal and maximal values is compared (306) to a maximal tolerance value, for which values are still considered belonging to a same run of values. If (306) the difference between min and max is greater (330) than the allowed tolerance (i.e., |max−min|>tolerance), the previous run is closed (310) and a new run is started in act 302. Closing (310) the previous run includes storing the average value (avg) of the samples of the run together with the number of samples in the run (count). Alternatively or additionally to storing the average, the sum (acc) is stored. If (306) the difference between min and max is within the allowed tolerance, the value of new is added (315) to acc, and count is incremented by 1. Another value of the harmonic is then received (303).

After a plurality of rounds of running the method of FIG. 3, an array of pairs of values of avg and count are received. Generally, in electrical power signals, the same or very similar harmonic values appear over many consecutive cycles of the main power frequency. Therefore, a representation of many cycles of an electrical signal can be achieved using a relatively small number of pairs of values and the number of consecutive cycles in which they appear.

It is noted, that the equality of values is especially true for some of the harmonics, such that even if for some harmonics the savings using the compression method of the present invention is relatively low, the savings in some of the harmonics is very large.

In some embodiments of the invention, instead of storing the harmonic values themselves, the ratio between two harmonics, which are known to be related, are stored. In some cases, such ratio is more stable than the values themselves. In an exemplary embodiment of the invention, the ratio between high harmonics and the fundamental harmonic is used. Alternatively or additionally, compression unit 100 selects in real time whether to store the harmonic values themselves or the ratios, according to which option currently provides more stable values.

In some embodiments of the invention, the tolerance value is set as a percentage of the nominal value of the harmonic. Alternatively, the tolerance value is set as a percentage of the fundamental harmonic or of the total signal. The tolerance is optionally configured according to a desired tradeoff between accuracy and compression ratio. In the configuration, the inaccuracy of the measurement of the signals is optionally taken into account, such that the tolerance percentage is not smaller than the inaccuracy in the signal measurement. It is noted that in cases in which the inaccuracy is relatively high (e.g., 0.1% of the measured values) the tolerance value may be set to the inherent inaccuracy of the measurement apparatus, such that information is not lost due to the lossy compression. In an exemplary embodiment of the invention, a tolerance of between 0.1-1% of the nominal value, is used. Alternatively to using a pre-configured tolerance value, the tolerance value is adjusted over time according to parameters of the compression. In an exemplary embodiment of the invention, the tolerance value is adjusted according to the compression ratio achieved. Optionally, each time a data record 414 (FIG. 4) is completed, the compression ratio of the record 414 is determined and accordingly the tolerance of the next data record is selected, in order to achieve a desired compression ratio.

Optionally, the same tolerance is used for all the signals compressed. Alternatively, different tolerance values are used for different harmonics and/or parameters, for example according to the importance of each of the harmonics and/or parameters. The nominal value is optionally a configured predetermined expected value of the harmonic. Alternatively, the nominal value is an average value which is determined based on the value of the harmonic over recent cycles.

In some embodiments of the invention, for harmonics having complex values, the method of FIG. 3 is performed separately for the real and imaginary parts of the harmonics. Alternatively, the method is performed on the complex values of the harmonics together, the comparison to the tolerance being performed based on the magnitude of the difference between min and max. Further alternatively or additionally, the method of FIG. 3 is performed separately on the amplitudes and phases of the values of the harmonics.

Figure 4:
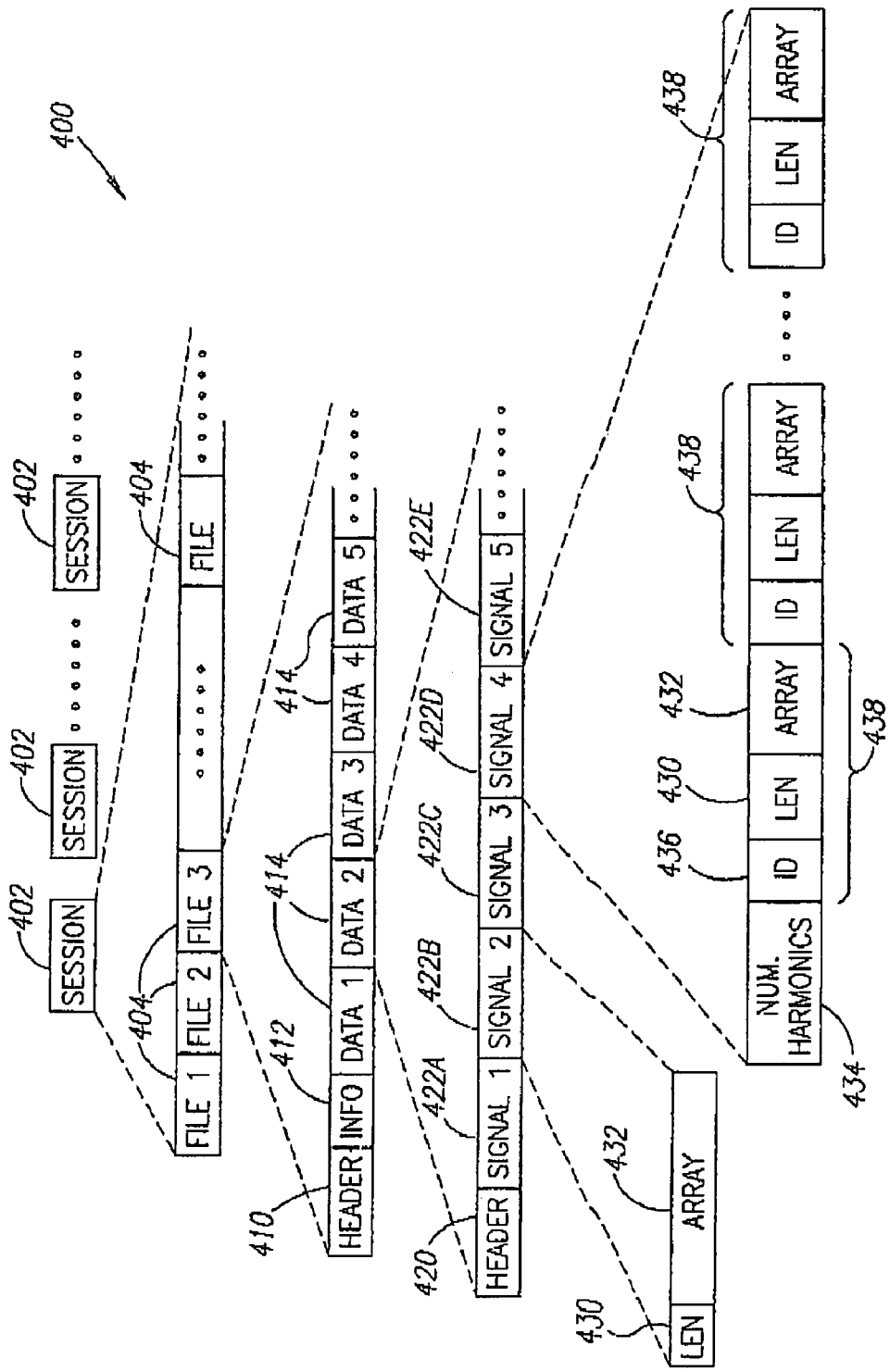
FIG. 4 is a schematic illustration of a storage arrangement of compressed data, in accordance with an exemplary embodiment of the invention.

FIG. 4 is a schematic illustration of a storage arrangement 400 of compressed data, in accordance with an exemplary embodiment of the invention. The compressed data is optionally organized in files 404, which belong to sessions 402. The files 404 of a single session 402 are acquired consecutively, such that there is no data gap between files 404 of a single session 402. Between sessions 402, however, there may be a data gap, for example due to a momentary power outage and/or a user stop/start command.

Each file 404 optionally includes a header 410, an info record 412, which identifies the data types carried by the file, and data block records 414 which include compressed data. In some embodiments of the invention, each data block record 414 comprises a header 420 and signal fields 422 (marked 422A, 422B, 422C, etc.), each signal field 422 corresponding to a single signal monitored by compression unit 100. For signals relating to a single value parameter, such as illustrated by signal field 422B. Signal field 422B comprises a length field 430 and an array 432 of pairs of average values (avg, FIG. 3) and the numbers of times they appear consecutively in the monitored signal (count, FIG. 3). The values of the array 432 are stored in act 310 of FIG. 3. In some embodiments of the invention, the average values are stated by indicating a ratio between the average value and a nominal value of the signal. The use of a ratio generally reduces the storage space required for storing the average value.

Signal fields 422 that refer to waveform signals represented by their harmonics, are represented in FIG. 4 by signal 422D, which comprises a plurality of harmonic fields 438, corresponding to harmonics of the signal, and a number field 434 indicating the number of harmonic fields 438 in the signal field 422D. Each harmonic field 438 optionally includes an ID field 436 indicating the harmonic to which the harmonic field 438 relates, an array field 432 including pairs of average values and the number of times they appear consecutively, and a length field 430 indicating the number of pairs in the array field 432. In some embodiments of the invention, harmonics having a zero value are not listed in signal field 422D. Many high harmonics usually have a zero value in power line signals, such that not storing zero value harmonics is advantageous. Alternatively, signal field 422D includes a harmonic field 438 for each of the calculated harmonics, such that all signal fields 422D have the same number of harmonics and ID fields 436 and number field 434 are not required. Further alternatively, when advantageous, number field 434 indicates that there are values for all the harmonics and ID fields 436 are not used.

Optionally, when the values of a harmonic change in substantially every cycle over a relatively long period (e.g., above 10 cycles), a different format of storage is used, for example storing the measured values alone and/or storing the differences between consecutive values. Optionally, a special indication is used to signal the use of the different format.

The order of the harmonics within signal fields 422D is selected, in some embodiments of the invention, arbitrarily, for example from the fundamental harmonic sequentially up to the highest harmonic (e.g., 127). Alternatively, a harmonic order is selected which is expected to achieve a better lossless compression of the file, e.g., using the LZW compression. Optionally, the harmonic order is selected according to the lossless compression method used on files 404 and the expected similarity of the harmonics. In an exemplary embodiment of the invention, the odd harmonics are stored separately from the even harmonics. Alternatively or additionally, the harmonics are stored in a descending order.

In some embodiments of the invention, substantially all data records 414 include data of the same signals. In an exemplary embodiment of the invention, the signals stored in records 414 include a current waveform signal and a voltage waveform signal, which are represented by long signal fields 422D. In addition, the signals stored by records 414 optionally include root mean square (RMS) voltage and RMS current. Alternatively, different data records 414 relate to different sets of signals.

Header 420 of data record 414 optionally indicates the beginning time and/or ending time of the data to which the record 414 relates. In some embodiments of the invention, the time indication uses an internal time scheme of compression unit 100 in header 420. As described below, info record 412 of each file optionally states a regional time (i.e., a standard time) and a corresponding internal time, to be used for conversion of the internal time to the standard (regional) time. The use of the internal time within headers 420 allows using a shorter time field and/or eliminates the possibility of a time contradiction due to erroneous human setting of the regional time during the acquiring the data of a single file. The regional time allows comparison of the compressed data to data of other compression units 100 and/or to other events. The regional time is optionally stated in each file 404, so that clock skew of the internal time does not cause a large drift of the time indicated for the acquired data.

Data records 414 of a file 404 optionally each relate to signals of a unique time period, such that all the signals of a specific time period are included in a single data record 414. The data records 414 of a single file 404 are optionally ordered sequentially according to the time period to which they relate. Optionally, different data records 414 relate to time periods of different lengths. In some embodiments of the invention, data records 414 are limited to relating to data of a time period of up to a predetermined length, for example 2-10 minutes, e.g., 5 minutes. In some embodiments of the invention, the predetermined maximal time period is selected so as to limit the extent of the change in the main power frequency over time, as the arrays 432 use the number of cycles as a type of time indication.

Alternatively or additionally, data block records 414 have up to a maximal size, for example between about 0.5-2 Mbytes. Further alternatively or additionally, data records 414 are limited by the size of the original uncompressed data, such that it is simple to manipulate the data of a single record 414 on a single processor. In an exemplary embodiment of the invention, data records 414 are limited to relating to up to between 2-20 Mbytes of data.

Files 404 are optionally limited to being not greater than a size which is practically managed by computation (e.g., decompression) and storage units, such as up to 20-40 Mbytes. Alternatively or additionally, files 404 are limited in the time span to which they relate (e.g., no more than a day or a week) and/or in the number of data records 414 they include. In some embodiments of the invention, files 404 are not limited in the time span to which they relate and/or in the number of records they include.

In some embodiments of the invention, when configuration parameters of compression unit 100 change and/or any other information in info record 412 changes, the current file 404 is closed and a new file 404 is opened. Thus, the data in header 410 and info record 412 of a single file 404 relates to the entire file without changes. Alternatively or additionally, one or more of the fields of info record 412 includes room to state different configuration values for different data records 414 and/or different signals 422.

File header 410 optionally identifies the session 402 to which the file 404 belongs and the position of the file 404 within the session. In some embodiments of the invention, file header 410 further states a type and version, as is known in the art. Alternatively or additionally, file header 410 states a regional time at which the data of the file begins and/or ends. Further alternatively or additionally, file header 410 states an internal clock point at which the data of the file begins and/or ends. In some embodiments of the invention, header 410 includes a string field which may be used by a user to identify the file.

Info record 412 optionally includes all configuration information required in order to understand the contents of the file 404, such that each file 404 is a stand alone unit. Alternatively, some information which generally does not change is included only in a first file 404 of each session 402. Optionally, when a change occurs during a session, the changed information is included in the file 404 in which the change occurred or in all files 404 that have values different from indicated in the first file of their session 402.

Info record 412 optionally includes an indication of whether the data in the file is encrypted and/or compressed and/or the type of encryption and/or compression used. Optionally, info record 412 also includes a product type indication, relating for example to the type of the equipment used, network topology information and/or the number of signals and/or types for which data is stored. In an exemplary embodiment of the invention, info record 412 includes various general character strings which state user understandable information on the data, such as operator and company name. Info record 412 optionally also indicates the beginning time and/or ending time of the time period to which the file 404 relates. Optionally, info record 412 indicates events at which the correspondence between the internal time and the regional time was updated, by a user or automatically.

In some embodiments of the invention, for each signal for which data is collected, info record 412 indicates the type of the signal (e.g., one of a wave represented by a plurality of harmonics, a real parameter, a complex parameter, a transient parameter) and a unique identifier of the signal, which is optionally at least partially human decipherable. Optionally, for each signal, info record 412 also indicates attributes used for the signal in the method of FIG. 3, such as the nominal value and the tolerance. Alternatively or additionally, for each signal, a conversion value and/or function used for converting the measured value to the real amplitude value (for example, due to transformer conversion ratios).

Info record 412 may optionally also include information on special events which are not properly represented by the compressed information stored in data records 414. For example, in some embodiments of the invention, compression unit 100 includes an interface suitable for identifying fast transient events of high frequencies. Optionally, data on such fast transient events is stored in info record 412 together with an indication of the time at which the event occurred. In some embodiments of the invention, info record 412 includes debugging information.

It is noted that the data stated herein as being included in info record 412 may be included instead, in part or entirely, in header 410 and/or in other records of file 404. For example, info record 412 may be split into a plurality of records that relate to different information.

In an exemplary example, eight signals (4 current and 4 voltage) are monitored by sampling at a rate of 12.6 KHz. Each sample optionally requires 2 bytes, such that the samples acquired each second require 204.8 Kbytes and over six months require about 6400 Giga Bytes. Using the above compression method, a compression ratio of about 1:1000 was achieved, and using an additional general purpose compression (LZW) a total compression ratio of about 1:10000 was achieved.

In the above described embodiments, compression unit 100 includes both analog sensor 110 and compressor 112 but does not include storage unit 120 which is a separate unit from compression unit 100. In other embodiments of the invention, analog sensor 110 and optionally A/D converter 114 are included in a separate unit from compressor 112, for example when the sensing is performed by a standard alarm monitoring unit. The alarm monitoring unit is altered to provide all data it senses to compressor 112, rather than only data sensed when an alarm event is identified. Alternatively or additionally, storage unit 120 is included within compression unit 100.

Compression unit 100 is not limited for use with any specific power wires and/or network topologies. Specifically, compression unit 100 may be used with any poly-phase or single phase power network. The measurement may also be applied to ground lines, may include fewer than all the power lines of a network and/or may relate to any combination of current and voltage measurements. In addition, compression unit 100 may be used with balanced or unbalanced networks, and substantially any network topologies, including delta/star or other hybrid networks, as well as other electrical points. Compression unit 100 may be used with substantially any voltage levels including low voltages, medium level voltages, high voltages and ultra-high voltages.

Although in the above description the compression is performed on parameters or harmonics of a single cycle of the main power frequency, the same compression method may be used on parameters determined less often or more often. In some embodiments of the invention, the transform is performed each time on a plurality of cycles together and the harmonics are compared for each plurality of cycles. Alternatively, the transform is performed on samples representing less than a power line cycle, for example half a cycle or a sixth of a cycle. These embodiments are used, for example in a power network which is known to have a repetitive interference with a frequency different from the power line cycle. In some embodiments of the invention, the frequency of the transform is predetermined. Alternatively, the frequency of the transform is adjusted according to the measured signals.

Alternatively or additionally, values of one or more of the parameters such as sag, swell and/or flickering is determined once every few cycles and the compression is performed accordingly. Further alternatively or additionally, the data of one or more waveforms may be stored twice, in high and low resolutions. The high resolution copy is optionally stored in each cycle with a relatively high compression tolerance, while the low resolution copy is stored only once every few cycles, with a much lower compression tolerance.

Alternatively to storing values of harmonics or parameters, compression unit 100 may store waveform patterns. Optionally, each time the waveform pattern changes substantially (e.g., more than 5-10%), the new pattern is stored.

It will be appreciated that the above described methods may be varied in many ways. It should also be appreciated that the above described description of methods and apparatus are to be interpreted as including apparatus for carrying out the methods and methods of using the apparatus.

The present invention has been described using non-limiting detailed descriptions of embodiments thereof that are provided by way of example and are not intended to limit the scope of the invention. For example, processor 118 is not necessarily included in compression unit 100. The functions of processor 118 may not be performed by unit 100 or may be performed by other elements of compression unit 100, such as compressor 112. It should be understood that features and/or steps described with respect to one embodiment may be used with other embodiments and that not all embodiments of the invention have all of the features and/or steps shown in a particular figure or described with respect to one of the embodiments. Variations of embodiments described will occur to persons of the art.

It is noted that some of the above described embodiments may describe the best mode contemplated by the inventors and therefore may include structure, acts or details of structures and acts that may not be essential to the invention and which are described as examples. Structure and acts described herein are replaceable by equivalents which perform the same function, even if the structure or acts are different, as known in the art. Therefore, the scope of the invention is limited only by the elements and limitations as used in the claims. When used in the following claims, the terms "comprise", "include", "have" and their conjugates mean "including but not limited to".

The invention claimed is:

1. A method of compressing values of a waveform of a monitored electrical power signal, comprising:
   acquiring samples of a power signal over a plurality of periods of the waveform;
   dividing the samples into groups, each of said groups determined based on a number of cycles of the power signal included in said group;
   decomposing the waveform of the power signal into a plurality of frequency components, over said plurality of periods of the waveform; and
   compressing values of at least some of the frequency components over said plurality of periods, separately.

2. A method according to claim 1, wherein compressing the values of at least some of the components comprises fitting time segments of the components into a model and recording coefficients of the fitting.

3. A method according to claim 2, wherein the model comprises a constant function over time.

4. A method according to claim 3, wherein the recorded coefficients for the constant function over time comprise a single value and a length.

5. A method according to claim 2, wherein the model comprises a monotonous function over time.

6. A method according to claim 1, wherein decomposing the waveform comprises transforming the samples of each group, into harmonic component values.

7. A method according to claim 6, wherein compressing at least some of the components separately comprises storing for each harmonic, pairs of an average value and a number of cycles in which the value is close to the average value.

8. A method according to claim 7, wherein the number of cycles in which the value is close to the average value is determined by determining a minimum and maximum of a train of harmonic values and determining when the distance between the minimum and maximum is greater than a predetermined distance.

9. A method according to claim 8, wherein the predetermined distance is a configured percentage of the average recent value of the harmonic.

10. A method according to claim 8, wherein the predetermined distance is a configured percentage of a configured expected value of the harmonic.

11. A method according to claim 6, wherein transforming the samples of each group comprises transforming using a fast Fourier transform.

12. A method according to claim 6, comprising applying a lossless compression method to the compressed harmonic component values.

13. A method according to claim 1, wherein acquiring the samples comprises acquiring an analog signal and sampling the analog signal based on a sampling rate determined by a main frequency of said power signal.

14. A method according to claim 1, wherein dividing the samples into groups comprises repetitively determining a main power frequency of the power signal and accordingly determining cycles of the power signal.

15. A method according to claim 14, wherein sampling the signals comprises sampling at a rate determined responsive to the main power frequency.

16. A method according to claim 14, wherein repetitively determining the main power frequency comprises determining the main power frequency from the acquired samples.

17. A method according to claim 14, wherein repetitively determining the main power frequency comprises determining the main power frequency from an analog signal from which the acquired samples are generated.

18. A method according to claim 1, comprising storing at least some of the compressed components in a file structure representing a plurality of power signals.

19. A method according to claim 1, comprising storing the compressed components in a file structure representing the power signal continuously over more than a month.

20. A method according to claim 1, comprising transmitting the compressed components over a communication link.

21. A method according to claim 1, wherein compressing at least some of the components comprises compressing each of the components separately.

22. A method according to claim 1, wherein compressing at least some of the components comprises compressing in real time.

23. A method according to claim 1, wherein compressing at least some of the components comprises compressing using a lossy compression.

24. A method according to claim 1, wherein compressing at least some of the components separately comprises compressing separately over at least three periods of the waveform.

25. A method according to claim 1, wherein the power signal comprises a current signal.

26. A method according to claim 1, wherein the power signal comprises a voltage signal.

27. A method according to claim 1, wherein acquiring samples of the power signal comprises acquiring data representing an identical number of samples per cycle of the power signal.

28. A method according to claim 1, wherein decomposing the waveform into a plurality of components comprises decomposing into components which co-extend in time.

29. A method according to claim 1,
   wherein compressing the values of at least some of the frequency components over a plurality of periods comprises compressing the samples of the power signal using a lossy compression method.

30. A method according to claim 29, wherein compressing the samples comprises compressing in real time.

31. A method according to claim 29, wherein acquiring the samples comprises acquiring at a rate of at least 50 samples per cycle of the power signal.

32. A method of storing a representation of a monitored electrical power signal, comprising:
   acquiring samples of the power signal;
   dividing the samples into groups, each of said groups determined based on a number of cycles of the power signal included in said group;
   transforming the samples of each group, into harmonic component values; and
   storing a representation of the harmonic component values on a non-volatile storage medium, continuously over at least a week.

33. A method according to claim 32, wherein storing the representation comprises storing a compressed representation of the harmonic component values.

34. A method according to claim 33, wherein storing the compressed representation comprises storing a compression based on compressing together values of each harmonic component over a plurality of cycles.

* * * * *